United States Patent
Bellorado et al.

(10) Patent No.: US 9,142,309 B2
(45) Date of Patent: Sep. 22, 2015

(54) GENERATION OF A COMPOSITE READ BASED ON NEIGHBORING DATA

(71) Applicant: SK hynix memory solutions inc., San Jose, CA (US)

(72) Inventors: Jason Bellorado, San Jose, CA (US); Arunkumar Subramanian, San Jose, CA (US); Marcus Marrow, San Jose, CA (US); Zheng Wu, San Jose, CA (US); Lingqi Zeng, Turlock, CA (US)

(73) Assignee: SK hynix memory solutions inc., San Jose, CA (US)

( * ) Notice: Subject to any disclaimer, the term of this patent is extended or adjusted under 35 U.S.C. 154(b) by 44 days.

(21) Appl. No.: 14/071,383

(22) Filed: Nov. 4, 2013

(65) Prior Publication Data
US 2014/0233317 A1    Aug. 21, 2014

Related U.S. Application Data

(60) Provisional application No. 61/766,614, filed on Feb. 19, 2013.

(51) Int. Cl.
*G06F 11/10* (2006.01)
*G11C 16/26* (2006.01)
*G11C 16/34* (2006.01)

(52) U.S. Cl.
CPC ............ *G11C 16/26* (2013.01); *G11C 16/3418* (2013.01)

(58) Field of Classification Search
CPC ................................................. G06F 11/11076
USPC ........................... 714/764, 743, 736; 365/148
See application file for complete search history.

(56) References Cited

U.S. PATENT DOCUMENTS

| | | | |
|---|---|---|---|
| 7,706,167 B2 * | 4/2010 | Toda et al. | 365/148 |
| 7,719,875 B2 * | 5/2010 | Toda et al. | 365/148 |
| 7,729,158 B2 * | 6/2010 | Toda et al. | 365/148 |
| 2008/0019185 A1 | 1/2008 | Li | |
| 2009/0106485 A1 | 4/2009 | Anholt | |
| 2010/0142281 A1 * | 6/2010 | Yoo et al. | 365/185.18 |
| 2010/0165730 A1 | 7/2010 | Sommer et al. | |
| 2011/0161775 A1 | 6/2011 | Weingarten | |
| 2012/0166913 A1 | 6/2012 | Alrod et al. | |
| 2012/0236641 A1 | 9/2012 | Hu | |
| 2013/0155776 A1 * | 6/2013 | Chilappagari et al. | 365/185.24 |

* cited by examiner

*Primary Examiner* — Fritz Alphonse
(74) *Attorney, Agent, or Firm* — Van Pelt, Yi & James LLP

(57) ABSTRACT

A victim group of one or more cells is read using a first read threshold to obtain a first raw read which includes one or more values. The victim group of cells is read using a second read threshold to obtain a second raw read which includes one or more values. A neighboring read, corresponding to a neighboring group of one or more cells associated with the victim group of cells, is obtained. A composite read is generated, including by selecting from at least the first raw read and the second raw read based at least in part on the neighboring read.

20 Claims, 14 Drawing Sheets

ε = Value in Neighboring Cell Does Not Affect a Related Cell in the Victim Group
Δ = Value in Neighboring Cell Affects a Related Cell in the Victim Group

|  | Cell 1 in Victim Group | Cell 2 in Victim Group | Cell 3 in Victim Group | |
|---|---|---|---|---|
| Neighboring Reads | 0 Aggressor Neighbors | 3 Aggressor Neighbors | 1 Aggressor Neighbor | 370 |
| Raw Read 1 | A | C | D | 372 |
| Raw Read 2 | E | G | H | 374 |
| Raw Read 3 | I | K | L | 376 |
| Raw Read 4 | M | O | P | 378 |
|  | Input by LLR Generator 350a; ignored by all other LLR Generators | Input by LLR Generator 350d; ignored by all other LLR Generators | Input by LLR Generator 350b; ignored by all other LLR Generators | |

FIG. 3C

| Page 604 Aggressor Value? | Page 606 Aggressor Value? | Page 608 Aggressor Value? | Page 610 Aggressor Value? | Page 612 Aggressor Value? | Total Coupling Coefficient |
|---|---|---|---|---|---|
| N (+0) | N (+0) | N (+0) | N (+0) | N (+0) | $a_i = 0.00$ |
| N (+0) | N (+0) | N (+0) | N (+0) | Y (+0.05) | $a_i = 0.05$ |
| N (+0) | N (+0) | N (+0) | Y (+0.05) | N (+0) | $a_i = 0.05$ |
| N (+0) | N (+0) | N (+0) | Y (+0.05) | Y (+0.05) | $a_i = 0.10$ |
| N (+0) | N (+0) | Y (+0.10) | N (+0) | N (+0) | $a_i = 0.10$ |
| N (+0) | N (+0) | Y (+0.10) | N (+0) | Y (+0.05) | $a_i = 0.15$ |
| N (+0) | N (+0) | Y (+0.10) | Y (+0.05) | N (+0) | $a_i = 0.15$ |
| N (+0) | N (+0) | Y (+0.10) | Y (+0.05) | Y (+0.05) | $a_i = 0.20$ |
| N (+0) | Y (+0.15) | N (+0) | N (+0) | N (+0) | $a_i = 0.15$ |
| N (+0) | Y (+0.15) | N (+0) | N (+0) | Y (+0.05) | $a_i = 0.20$ |
| N (+0) | Y (+0.15) | N (+0) | Y (+0.05) | N (+0) | $a_i = 0.20$ |
| N (+0) | Y (+0.15) | N (+0) | Y (+0.05) | Y (+0.05) | $a_i = 0.25$ |
| N (+0) | Y (+0.15) | Y (+0.10) | N (+0) | N (+0) | $a_i = 0.25$ |
| N (+0) | Y (+0.15) | Y (+0.10) | N (+0) | Y (+0.05) | $a_i = 0.30$ |
| N (+0) | Y (+0.15) | Y (+0.10) | Y (+0.05) | N (+0) | $a_i = 0.30$ |
| N (+0) | Y (+0.15) | Y (+0.10) | Y (+0.05) | Y (+0.05) | $a_i = 0.35$ |
| ⋮ | ⋮ | ⋮ | ⋮ | ⋮ | ⋮ |
| Y (+0.15) | Y (+0.15) | N (+0) | N (+0) | N (+0) | $a_i = 0.30$ |
| Y (+0.15) | Y (+0.15) | N (+0) | N (+0) | Y (+0.05) | $a_i = 0.35$ |
| Y (+0.15) | Y (+0.15) | N (+0) | Y (+0.05) | N (+0) | $a_i = 0.35$ |
| Y (+0.15) | Y (+0.15) | N (+0) | Y (+0.05) | Y (+0.05) | $a_i = 0.40$ |
| Y (+0.15) | Y (+0.15) | Y (+0.10) | N (+0) | N (+0) | $a_i = 0.40$ |
| Y (+0.15) | Y (+0.15) | Y (+0.10) | N (+0) | Y (+0.05) | $a_i = 0.45$ |
| Y (+0.15) | Y (+0.15) | Y (+0.10) | Y (+0.05) | N (+0) | $a_i = 0.45$ |
| Y (+0.15) | Y (+0.15) | Y (+0.10) | Y (+0.05) | Y (+0.05) | $a_i = 0.50$ |

FIG. 7

GENERATION OF A COMPOSITE READ BASED ON NEIGHBORING DATA

CROSS REFERENCE TO OTHER APPLICATIONS

This application claims priority to U.S. Provisional Patent Application No. 61/766,614 entitled READ-SIDE COMPENSATION OF CAPACITIVE COUPLING FOR NAND-BASED STORAGE DEVICES filed Feb. 19, 2013 which is incorporated herein by reference for all purposes.

BACKGROUND OF THE INVENTION

Capacitive coupling is an issue in NAND Flash where the writing of a cell (accomplished by injecting charge onto the floating-gate of a cell) adds charge to the floating-gates of one or more adjacent cells. As NAND Flash process geometry is reduced, the spacing between NAND cells is reduced, thus exacerbating this effect. Techniques which are able to mitigate capacitive coupling in floating-gate cells would be desirable. In some cases, these new techniques may have application in other fields.

BRIEF DESCRIPTION OF THE DRAWINGS

Various embodiments of the invention are disclosed in the following detailed description and the accompanying drawings.

FIG. 3C is a diagram showing an embodiment of portions of raw reads being selectively input depending upon the number of aggressor neighbors for a given cell.

FIG. 7 is a diagram showing an embodiment of total coupling coefficients for a floating-gate cell in a victim page.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
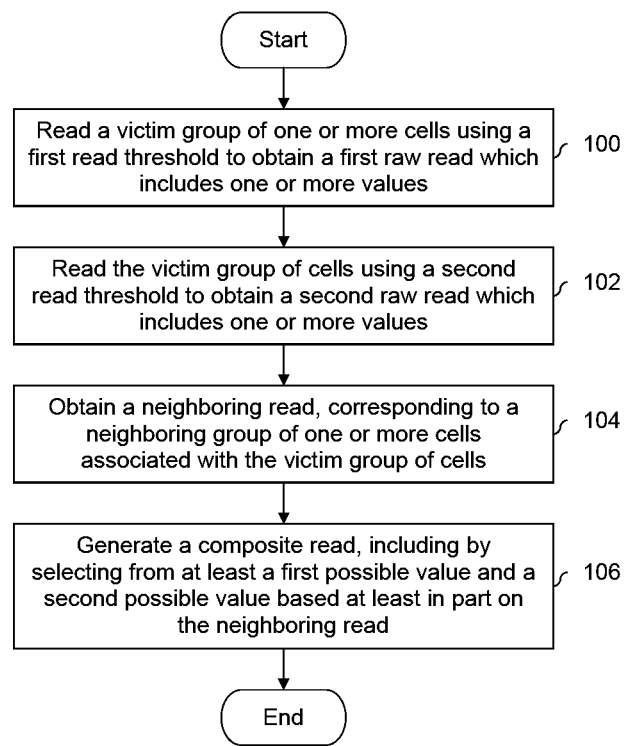
FIG. 1 is a flowchart illustrating an embodiment of a process for generating a composite read.

FIG. 1 is a flowchart illustrating an embodiment of a process for generating a composite read. In some embodiments, the process shown is used during error recovery, for example when a segment is unable to be successfully error correction decoded (e.g., after N reads of solid state storage using N different read threshold values which cause N different sets of hard read values to be returned).

At 100, a victim group of one or more cells is read using a first read threshold to obtain a first raw read which includes one or more values. To clearly differentiate between a composite read and the original, unmodified information which is read back from solid state storage, the latter is referred to herein as a "raw read." In various embodiments, a victim group of cells may comprise a page or a segment.

At 102, the victim group of cells is read using a second read threshold to obtain a second raw read which includes one or more values. The number of values in the first raw read (i.e., the length) obtained at step 100, as well as the number of values in the second raw read obtained at step 102, equal the number of cells in the victim group. Since the two read thresholds used at step 100 and 102 are different, the first raw read and the second raw read should not be identical. Any appropriate read threshold generation technique may be used to pick or select the first read threshold and the second read threshold.

At 104, a neighboring read, corresponding to a neighboring group of one or more cells associated with the victim group of cells, is obtained. A neighboring group of cells (for which a neighboring read is obtained at 104) has the potential to affect one or more values read back from the victim group of cells. In various embodiments, a variety of techniques are used at step 104 to obtain the neighboring read. In one example, a real-time read is triggered to the neighboring group of cells in solid state storage. In another example, the neighboring group of cells was previously desired by a host or application and a read processor successfully error correction decoded the neighboring read (e.g., one or more error correction codes indicate there are no errors). In some such embodiments, the neighboring read is obtained from a buffer which stores successfully decoded data.

In some embodiments, more than one neighboring group of cells is able to or has the potential to affect the victim group of cells, and so multiple neighboring reads are obtained at step 104. For example, one read associated with a left neighbor and one read associated with a right neighbor may be obtained at step 104. Or, in another example, one read associated with a top neighbor and one read associated with a bottom neighbor are obtained at 104.

At 106, a composite read is generated, including by selecting from at least a first possible value and a second possible value based at least in part on the neighboring read. A composite read is a read where the components are selected from two or more possibilities. In some embodiments (e.g., where a composite read includes hard values), the possible values come (e.g., directly) from the first raw read and the second raw read. For example, step 106 may be thought of as a multiplexer, where the output of the multiplexer is the composite read, the inputs to the multiplexer are the two or more raw reads, and the select(s) of the multiplexer are one or more neighboring reads. In some embodiments (e.g., where a composite read includes soft values), the possible values in step 106 include possible LLR values generated from (e.g., selective parts of) the first raw read and the second raw read. In some embodiments, generating a composite read at step 106 includes using three or more raw reads and/or using two or more neighboring reads.

The following figure shows an example read processor which performs the flowchart of FIG. 1.

Figure 2:
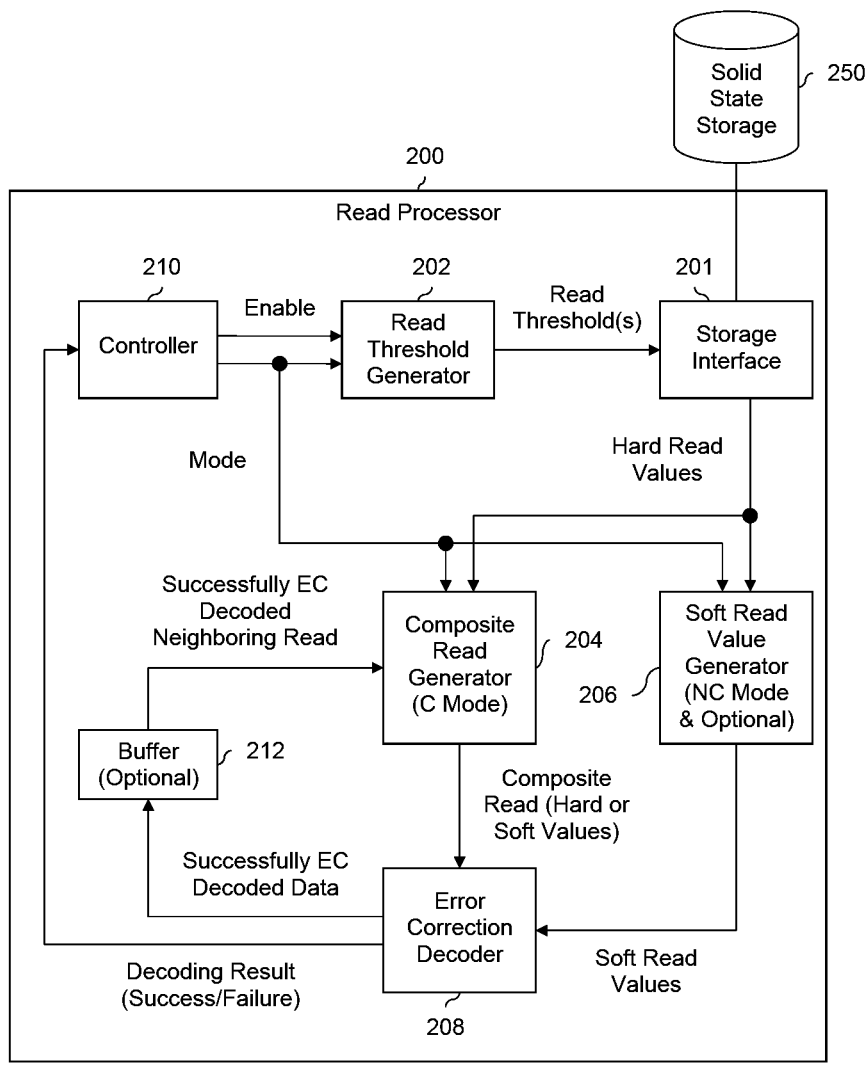
FIG. 2 is a diagram illustrating an embodiment of a read processor which is configured to generate composite reads.

FIG. 2 is a diagram illustrating an embodiment of a read processor which is configured to generate composite reads. In order to more clearly describe the technique, other components which are not directly related to generation of composite reads and/or use of composite reads are not necessarily shown. For example, a corresponding write processor is not shown, but that omission is not intended to be limiting. In some embodiments, read processor 200 is implemented using a semiconductor device, such as a field-programmable gate array (FPGA) or an application-specific integrated circuit (ASIC). In some embodiments, solid state storage 250 includes floating-gate transistors. In some other embodiments, solid state storage 250 includes 3D NAND.

In order to clearly describe the composite read generation technique, this figure will be described as if only one neighboring read and only two raw reads of the victim group of cells are used to generate a composite read. Naturally, that is not always the case and in some embodiments two or more neighboring reads (e.g., associated with two or more neighboring groups of cells which have the potential to affect the victim group of cells) and/or three or more raw reads of the victim group of cells may be used to generate a composite read.

In the example shown, read processor 200 begins in a non-composite mode. A victim group of cells in solid state storage 250 is desired to be read. Read threshold generator 202 is instructed by controller 210 to generate a read threshold using the enable signal and the mode signal, which is set to "not composite." In the non-composite mode, the neighboring group(s) signal (output by controller 210) is not used so read threshold generator 202 ignores that signal. Generation of composite reads is independent of read threshold generation techniques and so read threshold generator 202 includes any appropriate read threshold generation technique. In non-composite mode, a single read threshold is generated and that read threshold is used to read the victim group of cells in solid state storage 250. In this example, storage interface 201 is used to communicate with solid state storage 250.

Solid state storage 250 returns hard read values, where the values of the hard read values depend upon the read threshold used. In some embodiments, solid state storage 250 includes single-level cells (SLC) which are configured to store a single bit per cell. In such embodiments, each of the hard read values are 0 or 1. In some embodiments, solid state storage 250 includes multi-level cells (MLC) which are configured to store two bits per cell. In some embodiments, even when a cell contains two bits of information, both the read and write of that cell are separated into 2 different logical pages (e.g., x and y). Thus, page x is written (read) with a single bit per cell, and page y is written (read) with a single bit per cell. Thus, it is relatively transparent to a controller that two bits are physically being stored into a single cell.

In non-composite mode, soft read value generator 206 takes as input the hard read values from solid state storage 250 and ignores the composite read from composite read generator 204. Generation of composite reads is independent of soft read value generation techniques and so soft read value generator 206 may employ any appropriate technique. Soft read values corresponding to the hard read values (input from solid state storage 250) are output by soft read value generator 206 and are passed to error correction decoder 208. Note that soft read value generator 206 is optional (e.g., if error correction decoder 208 is a hard input decoder). If so, in non-composite mode, hard read values may be passed directly from storage interface 201 to error correction decoder 208.

Error correction decoder 208 performs error correction decoding on the soft read values. In one example, error correction decoder 208 is a low-density parity-check (LDPC) error correction decoder. In this example, error correction decoder 208 is a soft input decoder (e.g., decoder 208 takes log-likelihood ratio (LLR) values as input, where the sign (+/−) of the LLR value corresponds to a decision or hard value and the magnitude of the LLR value corresponds to a likelihood or certainty) and so optional soft read value generator 206 is used. If error correction decoder 208 is a soft input decoder, then during non-composite mode LLR values (or, more generally, soft read values) from soft read value generator 206 are input. If error correction decoder 208 is a hard input decoder, then during non-composite mode, hard read values from storage interface 201 are input.

After some number of attempts, error correction decoder 208 outputs a decoding result (e.g., success or failure) to controller 210. If error correction decoding is successful, then read processor 200 may reset or initialize to some starting state and move on to the next desired group of cells. If error correction decoding is not successful, then controller 210 decides whether to try again in the non-composite mode. If so, controller 210 asserts the enable signal and sets the mode signal to "not composite." The neighboring group(s) signal is not used in non-composite mode, so that signal is set to any appropriate value by controller 210.

If controller 210 decides to switch to composite mode, then controller 210 asserts the enable signal and sets the mode signal to "composite." In this mode, a neighboring read (associated with a neighboring group of cells which has the potential to affect the victim group of cells) is obtained. In some embodiments, an error correction decoded version of the neighboring read is available and that version is used. For example, read processor 200 may be doing a top-to-bottom read, and the neighboring group is located somewhere above the victim group so it has already been read and successfully decoded by the time the read processor gets to the current group of cells. In this example, successfully decoded data is passed from error correction decoder 208 to an optional buffer (212) where the successfully decoded data is stored. If available, the successfully decoded neighboring read is obtained from buffer 212 and is passed to composite read generator 204. Although not shown herein, controller 210 may indicate the neighboring group of cells to composite read generator 204 so that composite read generator 204 can query buffer 212 for the neighboring read.

Alternatively, if there is no buffer which stores successfully decoded data, or if buffer 212 exists but the neighboring read is not stored therein, a neighboring read may be obtained by reading from solid state storage 250. The neighboring read then comes in to composite read generator 204 as hard read values from solid state storage 250. In some embodiments, controller 210 indicates to read threshold generator 202 the address of the neighboring group of cells (not shown) so that read threshold generator 202 can output a best and/or last known read threshold for the neighboring group of cells (e.g., a read threshold which is appropriate for one group of cells (e.g., the victim group) may not be appropriate for another group of cells (e.g., a neighboring group)).

Composite read generator 204 also needs a first raw read of the victim group of cells and a second raw read of the victim group of cells. With the mode signal set to "composite" and the enable signal asserted, read threshold generator 202 will know to generate two read thresholds: one to obtain the first raw read and the other to obtain the second raw read. In one example, read threshold generator 202 generates the first read threshold ($x_1$) and the second read threshold ($x_2$) using two fixed offsets (e.g., $\Delta_1$ and $\Delta_2$) from a best and/or last known read threshold ($x_{best}$). That is, $x_1 = x_{best} + \Delta_1$ and $x_2 = x_{best} + \Delta_2$. In various embodiments, $\Delta_1$ and/or $\Delta_2$ may be negative values.

As described above, the composite read generation technique described herein is independent of read threshold generation techniques and any appropriate read threshold generation technique may be used. As such, whatever information is necessitated by that particular read threshold generation technique to generate a first read threshold (for the first raw read) and a second read threshold (for the second raw read) may be provided to a read threshold generation block. For example, the address or location of the victim group and/or one or more previous reads from the victim group may be provided to a read threshold generation block.

Using the two read thresholds generated by read threshold generator 202, two reads of the victim group in solid state storage 250 are performed. This returns a first raw read and a second raw read (in the form of hard read values) from solid state storage 250 to composite read generator 204. Composite read generator 204 takes the first raw read, the second raw read, and the neighboring read (e.g., from buffer 212 or solid state storage 250) and generates a composite read. In some embodiments, the process varies depending upon whether a composite read is to include either hard values (e.g., 0 or 1) or soft values (e.g., LLR values). More detailed examples of the composite read generation process are described in further detail below.

In composite mode, error correction decoder 208 takes as input the composite read generated by composite read generator 204. In various embodiments, a composite read may include hard values (e.g., if error correction decoder 208 is configured to input hard values) or soft values (e.g., if error correction decoder 208 is configured to input soft values, such as LLR values). When a victim group of cells includes both: (1) cells which have been affected by one or more neighboring groups of cells, as well as (2) cells which have not been affected by those same neighboring groups of cells, the composite read generated by composite read generator 204 has a better chance of being successfully decoded by error correction decoder 208 compared to other (e.g., raw) reads. This is described in further detail below.

If error correction decoder 208 outputs a decoding success, then read processor 200 may reset or initialize to a starting state and move on to the next victim group of cells. If decoding is not successful, then controller 210 in some embodiments may attempt to read and decode the victim group of cells again in composite mode. For example, any number of the read thresholds generated by read threshold generator 202 may be adjusted.

The following figures show an example hard output composite read generator and an example soft output composite read generator, respectively. In some embodiments, composite read generator 204 is implemented as shown in one of the following figures. In some other embodiments, a composite read generator is implemented in some other manner.

Figure 3A:
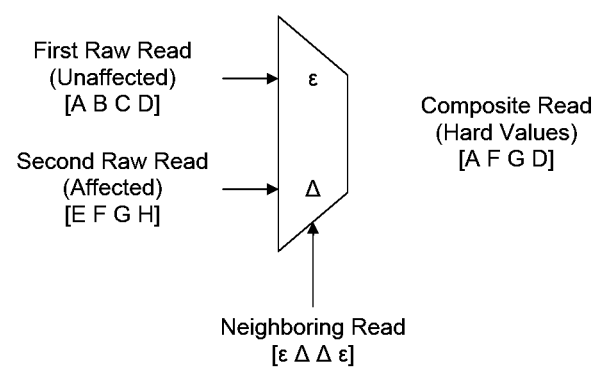
FIG. 3A is a diagram illustrating an embodiment of a hard output composite read generator.

FIG. 3A is a diagram illustrating an embodiment of a hard output composite read generator. In this example, the composite read being generated includes hard value. As in the previous figure, two raw reads and one neighboring read are used to generate the composite read in order to clearly describe the technique. This is merely exemplary and is not intended to be limiting (e.g., there may be three or more inputs to multiplexer 300 and/or two or more select signals to multiplexer 300).

In the example shown, the victim group of cells and the neighboring group of cells both include four cells. The first cell in the neighboring group has the potential to affect the first cell in the victim group, the second cell in the neighboring group has the potential to affect the second cell in the victim group, and so on. Whether or not a cell in a neighboring group affects a cell in a victim group depends upon the value stored in the cell in the neighboring group. For example, in solid state storage systems which use floating-gate transistors, the process of writing certain values to the $i^{th}$ cell in the neighboring group causes additional charge to be added to a capacitively coupled $i^{th}$ cell in the victim group. For example, writing a 01 or 10 to the $i^{th}$ cell in a neighboring group adds a noticeable and/or non-negligible amount of charge to the $i^{th}$ cell in the victim group (e.g., because the two cells are capacitively coupled). In contrast, writing a 00 or 11 to the $i^{th}$ cell in a neighboring group adds a negligible amount of charge to the $i^{th}$ cell in the victim group. Other systems may be affected in some other manner and other examples are described below.

The first raw read and the second raw read correspond respectively to unaffected values and affected values. This is achieved by selecting or generating first and second read thresholds which take into consideration how the victim group has been affected (for those cells which have been affected). To continue the floating-gate transistor example from above, affected cells in the victim group have additional charge added whereas unaffected cells in the victim group have had little or no additional charge added. As such, the first read threshold (which is used to obtain the first raw read) is set to a value that is greater than the second read threshold. In one example, the second read threshold may be set to some offset less than the last/best estimate and the first read threshold is set to some offset greater than the last/best estimate. As described above, any appropriate read threshold technique may be used and the composite read generation technique described herein is independent of read threshold generation.

The first raw read and the second raw read are the input signals to multiplexer 300 and the neighboring read is the select signal for multiplexer 300. For each bit or symbol, the multiplexer uses the neighboring read to select from either the first raw read (for that bit or symbol) or the second raw read (for that bit or symbol). For the first bit, since the first bit or symbol in the neighboring read is ϵ, the first bit or symbol from the first raw read (i.e., A) is selected as the first bit in the composite read. In this example, the symbol "ϵ" is used to represent a value in a neighboring cell that does not affect a related cell in the victim group. For example, in the MLC example described above, writing a 00 or a 11 to a neighboring cell does not affect a capacitively coupled cell in the victim group. The symbol "Δ" is used to indicate a value in a neighboring cell which affects a related cell in the victim group. For example, writing a 01 or a 10 to a neighboring cell adds additional charge to a capacitively coupled cell in the victim group. Repeating this selection process for all bits or symbols, a composite read of [A F G D] is generated by multiplexer from the first raw read of [A B C D], the second raw read of [E F G H], and the neighboring read of [ϵΔΔϵ] where the composite read includes hard values (i.e., A, F, G, and D are all hard values).

In some embodiments, a composite read generator is configured to generate composite reads which include soft values. The following figures shows one example of this.

Figure 3B:
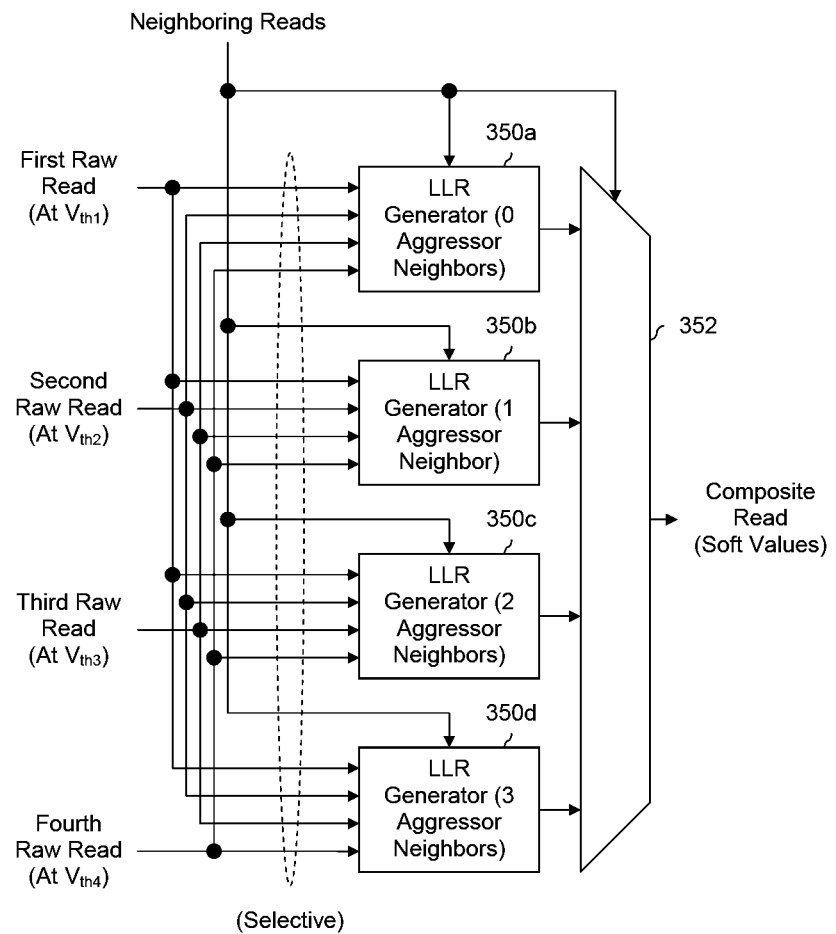
FIG. 3B is a diagram illustrating an embodiment of a soft output composite read generator.

FIG. 3B is a diagram illustrating an embodiment of a soft output composite read generator. In this example, the composite read being generated includes soft value. Note that the numbers of raw reads and/or classes is merely exemplary and is not intended to be limiting.

In this example, four raw reads are input to the composite read generator. The first raw read is obtained by reading the victim group using a read threshold of $V_{th1}$, the second raw read is obtained by reading the victim group using a read threshold of $V_{th2}$, the third raw read is obtained by reading the victim group using a read threshold of $V_{th3}$, and the fourth raw read is obtained by reading the victim group using a read threshold of $V_{th4}$.

In the example shown, there are four LLR generators. LLR generator 350a is configured for no aggressor neighbors, LLR generator 350b is configured for one aggressor neighbor, LLR generator 350c is configured for two aggressor neighbors, and LLR generator 350d is configured for three aggressor neighbors. Each of LLR generators 350a-350d is configured to generate a particular set of one or more LLR values based at least in part on a corresponding subset from the first raw read, a corresponding subset from the second raw read, a corresponding subset from the third raw read, and a corresponding subset from the fourth raw read.

Depending upon the number of aggressor neighbors for the victim group of cells (indicated by the neighboring reads), LLR generators 350a-350d selectively input parts of the first raw read, the second raw read, the third raw read, and the fourth raw read. Note that each of the subsets of the raw reads input by LLR generators 350a-350d are mutually exclusive (i.e., LLR generator 350a and LLR generator 350b have no overlapping inputs from the first raw read, and so on). The following figure shows an example of this.

FIG. 3C is a diagram showing an embodiment of portions of raw reads being selectively input depending upon the number of aggressor neighbors for a given cell. FIG. 3C continues the example of FIG. 3B. In the example shown, the victim group of cells includes three cells. Neighboring read 370 indicates that the first cell in the victim group has no aggressor neighbors, the second cell in the victim group has three aggressor neighbors, and the third cell in the victim group has one aggressor neighbor.

Since LLR generator 350a corresponds to no aggressor neighbors, the values corresponding to the first cell in raw reads 372, 374, 376, and 378 are input by LLR generator 350 (i.e., A, E, I, and M); those values are ignored by all other LLR generators. Similarly, since LLR generator 350d corresponds to three aggressor neighbors, the values from the raw reads corresponding to the second cell are input by LLR generator 350d but are ignored by the other LLR generators. The third cell has one aggressor neighbor, so the values from the raw reads corresponding to the third cell are input by LLR generator 350b but are ignored by all other LLR generators.

Returning to FIG. 3B, the neighboring reads passed to LLR generators 350a-350d enable the LLR generators to selectively input which values from the first through fourth raw reads are related to the class or case for that particular LLR generator. In other words, the neighboring reads act to segregate the values in the raw read values, so that each LLR generator only inputs and/or takes into consideration those values that correspond to that particular case or class (e.g., no aggressor neighbors, one aggressor neighbor, etc.). Values corresponding to another case or class are ignored.

Using the segregated values, each of LLR generators 350a-350d generates LLR values for cells which fall into that particular class. For example, in FIG. 3C, LLR generator 350a would generate an LLR value for the first cell in the victim group, LLR generator 350d would generate an LLR value for the second cell in the victim group, and LLR generator 350b would generate an LLR value for the third cell in the victim group.

Depending upon how many aggressor neighbors a given cell in the victim group has (e.g., gleaned from the neighboring reads), multiplexer 352 selects an appropriate set of LLR values generated by one of LLR generators 350a-350d. In the example of FIG. 3C, multiplexer 352 would select the output of LLR generator 350a for the first cell in the victim group, multiplexer 352 would select the output of LLR generator 350d for the second cell in the victim group, and multiplexer 352 would select the output of LLR generator 350b for the third cell in the victim group.

The following figures describe floating-gate transistor systems and how some cells in such systems can be affected by neighboring cells. These figures illustrate how composite reads are better quality read values compared to raw reads and/or how composite reads have a better chance of being successfully decoded compared to raw reads in floating-gate transistor systems.

Figure 4:
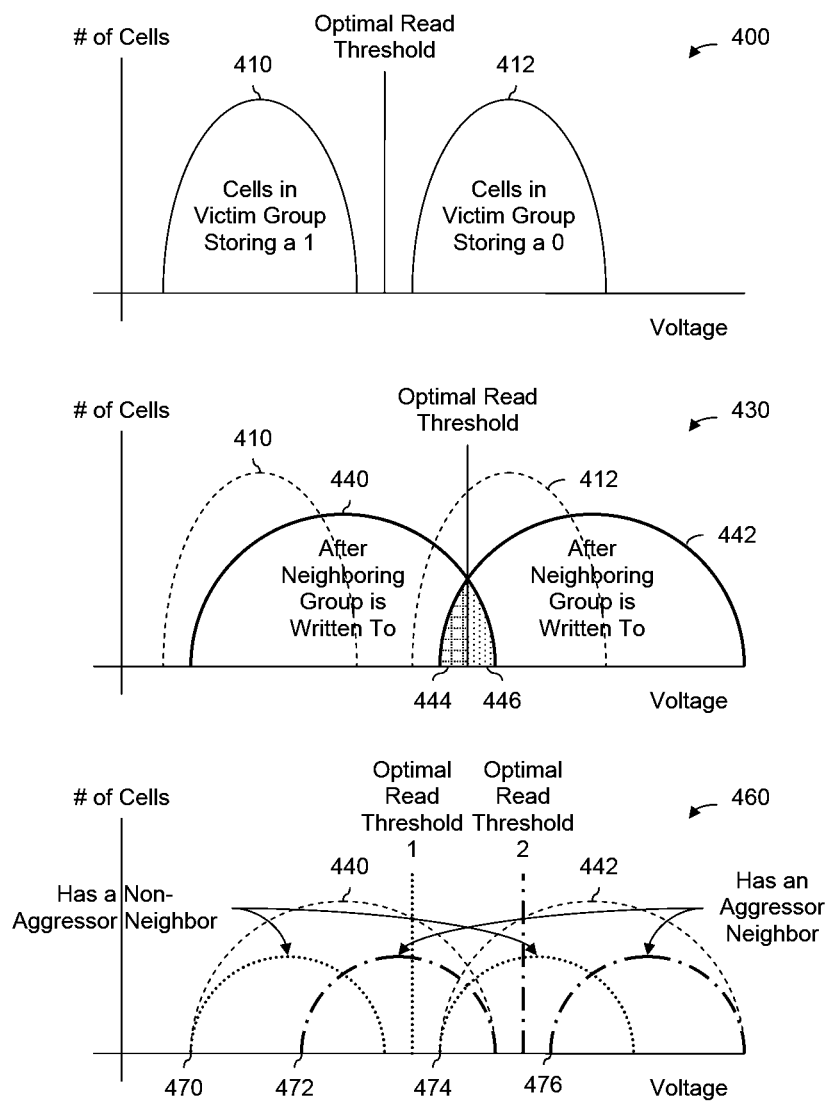
FIG. 4 is a diagram illustrating an embodiment of voltage distributions associated with floating-gate transistors.

FIG. 4 is a diagram illustrating an embodiment of voltage distributions associated with floating-gate transistors. In the example shown, diagram 400 shows two distributions for a victim group of cells before a neighboring group of cells is written to. Distribution 410 shows the distribution of cells in the victim group which store a 1 and distribution 412 shows the distribution of cells in the same victim group which store a 0. Note that distributions 410 and 412 do not overlap and so there would be no read errors when using the optimal read threshold shown in diagram 400. For clarity, an SLC example is shown where only a 1 or a 0 is stored, but the concepts described herein apply to MLC embodiments and other embodiments where multiple bits are stored per cell.

Diagram 430 shows the same distributions after a neighboring group of cells is written to. In this floating-gate transistor example, writing to the neighboring group of cells causes additional charge to be added to the victim group of cells. Distribution 410 becomes distribution 440 and distribution 412 becomes distribution 442. As is shown in diagram 430, writing to the neighboring group causes the center of distributions 410 and 412 to shift up and spread out (i.e., widen).

Note that with distributions 440 and 442, the optimal read threshold (i.e., the voltage at which distributions 440 and 442 cross each other) will produce a non-zero number of read errors. In diagram 430, the cells corresponding to region 444 (shown with a grid pattern) will be erroneously read as a 1 when they should be read as a 0. Similarly, the cells corresponding to region 446 (shown with a dotted pattern) will be erroneously read as a 0 when they should be read as a 1. Those read errors may surpass the error correction capability of an error correction decoder and may prohibit the victim group of cells from being successfully decoded.

Diagram 460 shows distributions 440 and 442 broken down into their conditional distributions. Distribution 440 is broken down into conditional distributions 470 and 472 where distribution 470 corresponds to cells in the victim group storing a 1 and which had a non-aggressor neighbor. In other words, those cells associated with distribution 470 store a 1 and had a negligible amount of additional charge added as a result of the write to the neighboring group. For example, a corresponding neighboring cell may have been written with a value that caused little or no additional charge to be added to a corresponding cell in the victim group (e.g., a 00 or 11 was written to a corresponding cell in the neighboring group).

Distribution 472 corresponds to cells in the victim group storing a 1 and which had an aggressor neighbor. In other words, those cells in distribution 472 store a 1 and had a noticeable or significant amount of charge added as a result of the write to the neighboring group.

Similarly, distribution 442 (i.e., cells in a victim group storing a 0) can be broken down into distribution 474 (i.e., those cells in the victim group storing a 0 with a non-aggressor neighbor) and distribution 476 (i.e., those cells in the victim group storing a 0 with an aggressor neighbor).

With conditional distributions 470, 472, 474, and 476, the optimal read thresholds shown in diagram 460 are very effective at properly differentiating between cells storing a 0 and a 1. Optimal read threshold 1 is used to differentiate between cells in distributions 470 and 474 (i.e., those cells in the victim group with a non-aggressor neighbor) and optimal read threshold 2 is used to differentiate between cells in distributions 472 and 476 (i.e., those cells in the victim group with an aggressor neighbor).

Returning to FIG. 1, conceptually, the first (second) read threshold used at step 100 (102) in FIG. 1 may be thought of as an approximation of optimal read threshold 1 in diagram 460. Similarly, the second (first) read threshold used at step 102 (100) in FIG. 1 may be thought of as an approximation of optimal read threshold 2 in diagram 460.

Similarly, the neighboring read (obtained at step 104 in FIG. 1) may be conceptually thought of as a guess as to which conditional distribution a given cell belongs to. For example, a read processor does not know which cells are members of distributions 470, 472, 474, and 476, respectively. In order to make a "best guess" assignment of a given cell to one of distributions 470, 472, 474, or 476, the neighboring read is used.

Any number of raw reads of the victim group may be used to generate a composite read. The following figure shows an example where four raw reads are used to generate a composite read.

Figure 5:
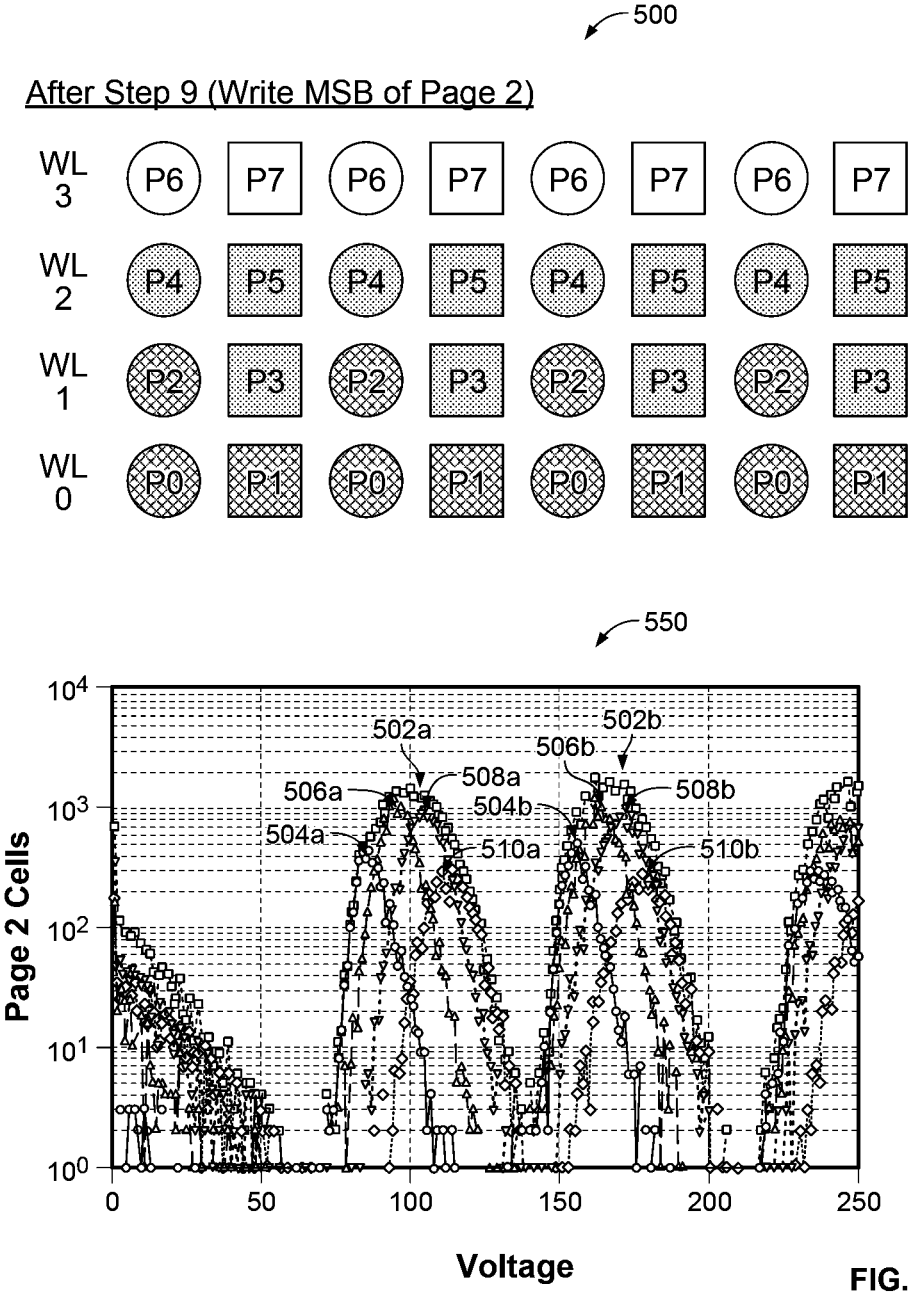
FIG. 5 is a diagram illustrating an embodiment of four conditional distributions associated with a two-step writing process.

FIG. 5 is a diagram illustrating an embodiment of four conditional distributions associated with a two-step writing process. In the example shown, the solid state storage system (not shown) includes floating-gate transistors which are used in a two bit configuration (i.e., it is an MLC embodiment) where each cell has an MSB and an LSB. Diagram 500 shows that each wordline includes a plurality of pages, and each page includes a plurality of cells (not shown). In this example, a victim group of cells and a neighboring group of cells comprise pages. The structure shown in diagram 500 is an example of an "even-odd" bit line structure.

In this example where the cells have an even-odd bit line structure, an MLC page is written to in two steps: first the LSB of the page is written to, followed by the MSB of the page. Since writing an LSB requires the addition of approximately 2-2.5 volts to the floating-gate of a cell (and writing the MSB requires the addition of about half that much voltage), the MSB write will induce about half of the capacitive coupling as the LSB write. Thus, manufacturers have specified the sequence of writing to an MLC NAND block in such a way as to reduce the residual capacitive coupling after a page is completely written to (e.g., after the MSB of a given page has been written to). The order of writes for the pages shown in diagram 500 is:

1. Write LSB of page 0
2. Write LSB of page 1
3. Write LSB of page 2
4. Write LSB of page 3
5. Write MSB of page 0
6. Write MSB of page 1
7. Write LSB of page 4
8. Write LSB of page 5
9. Write MSB of page 2
10. Write MSB of page 3
11. Write LSB of page 6
12. Write LSB of page 7
13. Write MSB of page 4
14. Write MSB of page 5

To understand how the above sequence of writes affects a given page, consider the example of page 2. After step 9, the MSB for page 2 has been written and, therefore, page 2 is completed. At this point, the pages shown with dotted pattern in diagram 500 have only had their LSB written (i.e., they are still incomplete), whereas those shown with a grid pattern have had both their LSB and MSB written to (i.e., they are complete). Cells shown without shading have had neither their LSB nor their MSB written to (i.e., they are in an erased state).

As diagram 500 shows, the pages which are adjacent to page 2 and which are incomplete (shown with a dotted pattern where the LSB of those pages has already been written) are pages 3, 4, and 5. Thus, when these pages are written, only the MSB will couple to page 2 and, therefore, the overall residual coupling after all pages are completed will be minimized. As described above, an aggressor neighbor is defined as any neighboring cell for which (LSB=0 and MSB=1) or (LSB=1 and MSB=0) is being written. In this example, only cells written with one of these values will add significant voltage to the floating-gates of victim cells during the write of the MSB.

In this example, it is assumed that only the data written to pages 3 and 4 have the ability to affect the final cell voltage distributions of page 2. For example, although page 0 is next to page 2, page 0 has already been completely written (e.g., it is shown with a dashed pattern, indicating a completed page) so page 0 cannot act as an aggressor to page 2 since there is nothing left to write to page 0. For simplicity, it is assumed that only immediate horizontal neighbors and immediate vertical neighbors have the ability to affect a given cell. Immediate diagonal neighbors and "two hop" neighbors are assumed to not affect a given cell in this example (e.g., page 5 and page 6 are assumed to have no impact on page 2).

Immediately following completion of the write to page 2 (i.e., after step 9 above, not shown in FIG. 5), there is no capacitive coupling induced on page 2. Note that this simplification or assumption is not intended to be limiting; immediate diagonal neighbors, "two hop" neighbors, and/or any other types of neighbors may be taken into consideration if desired.

Diagram 550 shows the distributions of page 2 after step 14 (i.e., after the MSB writes to pages 3, 4, and 5 have been completed). Distributions 502a and 502b are for all cells in page 2, whereas conditional distributions 504a/504b, 506a/506b, 508a/508b, and 510a/510b have been conditioned on the data written to pages 3 and 4. As described above, only pages 3 and 4 are considered potential aggressor neighbors for page 2. Furthermore, it is assumed that their coupling coefficients are equivalent (i.e., they contribute the same amount of additional charge to page 2, if they are an aggressor). Conditional distributions 504a/504b, 506a/506b, 508a/508b, and 510a/510b represent 0, 1, 2, and 3 aggressor neighbors, respectively.

In this example, a composite read for page 2 would be generated from four raw reads of page 2: a first raw read corresponding to distributions 504a and 504b, a second raw read corresponding to distributions 506a and 506b, a third raw read corresponding to distributions 508a and 508b, and a fourth raw read corresponding to distributions 510a and 510b. The corresponding first through fourth read thresholds would go from lowest voltage to highest voltage in this example.

As for the neighboring reads used to generate a composite read for page 2, four reads are used: two reads (i.e., the LSB read and the MSB read) for page 3 and 2 reads (i.e., the LSB read and the MSB read) for page 4 to the left and right. For a given page 2, the value of the page 4 above it, the value of the page 3 to the left of it, and the value of the page 3 to the right of it are considered.

It is noted that the leftmost page 2 does not have a column of pages to its left. As such, there are only three possibilities: 0 aggressor neighbors (i.e., neither the page 4 above it nor the page 3 to the right of it are aggressor neighbors), 1 aggressor neighbor (i.e., only one of the page 4 above it or the page 3 to the right of it is an aggressor neighbor), or 2 aggressor neighbors (i.e., both the page 4 above it and the page 3 to the right of it are aggressor neighbors). A composite read generator is configured to handle these edge pages or other exceptions appropriately.

In the examples described above, it is assumed that aggressor neighbors contribute the same amount of additional charge to a victim cell (or, more generally, affect a victim cell to the same degree or same amount). The following figure describes a floating-gate transistor example in which different amounts or levels of capacitive coupling are taken into consideration.

Figure 6:
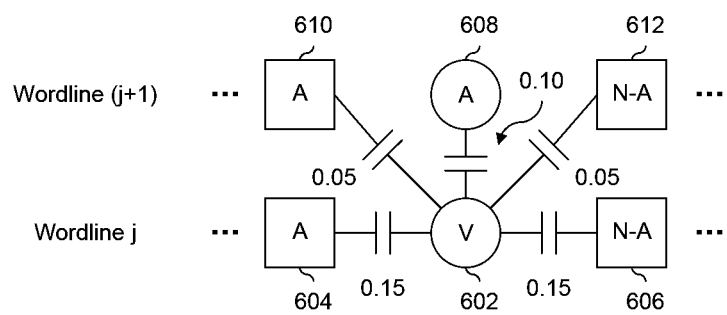
FIG. 6 is a diagram illustrating an embodiment where aggressor neighbors contribute different amounts of capacitive coupling to a victim cell.

FIG. 6 is a diagram illustrating an embodiment where aggressor neighbors contribute different amounts of capacitive coupling to a victim cell. In the example shown, there are two adjacent wordlines. Even pages are shown as circles and odd pages are shown as squares. In this example, the victim page under consideration (for which a composite read is being generated) is victim page 602. Note that victim page 602 is an even page.

The coupling coefficient between adjacent cells in the same wordline (e.g., between page 604 and page 602 and between page 602 and page 606) is 0.15. The coupling coefficient between adjacent cells in the same bitline (e.g., between page 608 and page 602) is 0.10. The coupling coefficient between cells in adjacent bitlines and wordlines (e.g., between page 610 and page 602 and between page 602 and age 612) is 0.05.

Suppose that cell i in victim page 602 has one of each of these types of aggressor neighbors. For example, suppose that related (e.g., capacitively coupled) cells in pages 604, 610, and 608 are written with values that cause them to victimize cell i in victim page 602 and related (e.g., capacitively coupled) cells in pages 612 and 606 are written with values that cause them to not victimize cell i in victim page 602. For this scenario, the total coupling coefficient for this cell is $a_i=0.15+0.10+0.05=0.30$ for cell i in victim page 602. Other possible total coupling coefficients for cell i in victim page 602 are shown in the next figure.

FIG. 7 is a diagram showing an embodiment of total coupling coefficients for a floating-gate cell in a victim page. FIG. 7 continues the example of FIG. 6 and shows possible total coupling coefficients for cell i in victim page 602, depending upon whether various capacitively coupled cells in neighboring pages act as an aggressor for cell i in the victim page. If the value stored in a neighbor is an aggressor value (e.g., 01 or 10), then the corresponding coefficient is added to the total coupling coefficient. If the value stored in a neighbor is not an aggressor value (e.g., 00 or 11), then the corresponding coefficient is not added to the total coupling coefficient.

In some embodiments, a total coupling coefficient (e.g., $a_i$) is used in generating a composite read. For example, suppose that n raw reads are used to generate a composite read. In such a system, n bins (e.g., spanning the lowest possible value of $a_i$ to the highest possible value of $a_i$) may be defined where if $a_i$ falls into the first bin, then the $i^{th}$ bit or symbol of the composite read is selected to be the $i^{th}$ bit or symbol from the first raw read. If $a_i$ falls into the second bin, then the $i^{th}$ bit or symbol of the composite read is selected to be the $i^{th}$ bit or symbol from the second raw read, and so on. In some embodiments, the n bins have equal widths or spans.

The examples described above have been limited (so far) to floating-gate transistor systems. The following figures describe 3D NAND systems and how composite reads may be generated and/or used in such systems.

Figure 8:
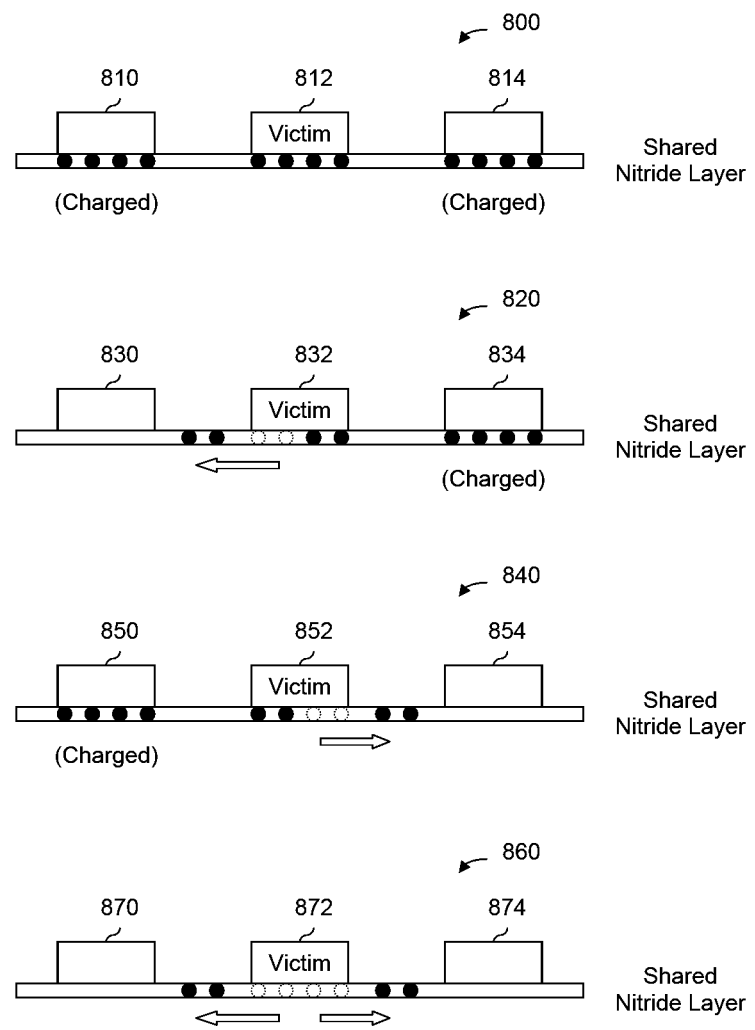
FIG. 8 is a diagram showing embodiments of 3D NAND cells.

FIG. 8 is a diagram showing embodiments of 3D NAND cells. In the example shown, various ways in which charged or uncharged neighboring cells affect a victim cell are described. In diagram 800, victim cell 812 and neighboring cells 810 and 814 are all charged. In 3D NAND, charge is stored in a shared nitride layer. Over time, charge can leak within the shared nitride layer; this is referred to as lateral charge migration. As is shown in diagram 800, when both neighbors of a given cell are charged, the charge stored by the neighbors acts as a retaining wall which prevents the charge of the victim cell from migrating throughout the shared nitride layer. Thus, victim cell 812 experiences relatively little loss of charge over time because both of neighbors 810 and 814 are charged.

In diagram 820, neighbor 834 is charged whereas neighbor 830 is not charged. As a result, some charge from victim cell 832 leaks out through the shared nitride layer. Note that the amounts of charge shown herein are not to scale and it is not necessarily the case that 50% of the charge stored by the victim cell is lost when this scenario occurs in real life. It is also noted that the charge lost by victim cell 832 is not acquired by neighboring cell 830 (e.g., because the charge migrates to a position between the cells), so the charge stored by neighboring cell 830 does not get added to.

Diagram 840 is similar to diagram 820. Neighboring cell 850 is charged but neighboring cell 854 is not charged, and so victim cell 852 loses some of its charge.

In diagram 860, both of neighboring cells 870 and 874 are not charged. In this case, nothing acts as a retaining wall and even more charge is lost than in diagrams 820 and 840. As before, the amount of charge shown is not to scale and it is not necessarily the case that all charge stored by victim cell 872 is lost.

Figure 9:
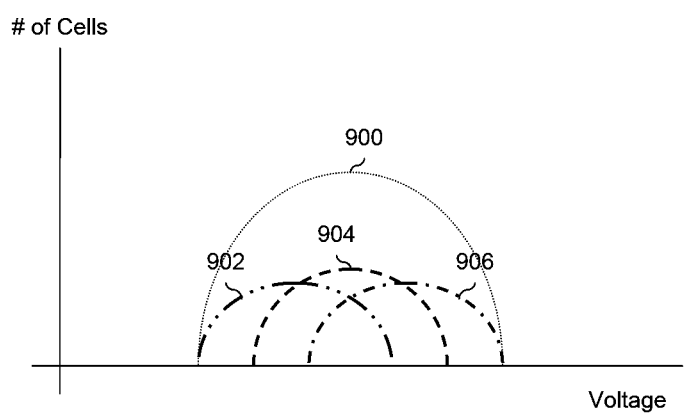
FIG. 9 is a diagram illustrating an embodiment of voltage distributions associated with a victim group of 3D NAND cells.

FIG. 9 is a diagram illustrating an embodiment of voltage distributions associated with a victim group of 3D NAND cells. In the example shown, distribution 900 shows the distribution for all cells in a victim group of cells which are charged. For example, the victim group of cells may include victim cells 812, 832, 852, and/or 872 from FIG. 8 because all of those victim cells are charged.

Distribution 900 may be broken down in to conditional distributions 902, 904, and 906. Conditional distribution 906 is associated with all charged cells in the victim group which have two charged neighbors. For example, victim cell 812 in FIG. 8 would be part of this conditional distribution. Conditional distribution 904 is associated with all charged cells in the victim group which have one charged neighbor and one uncharged neighbor. For example, victim cells 832 and 852 in FIG. 8 would be part of this conditional distribution. Note that some (e.g., moderate) amount of charge was for these cells, so conditional distribution 904 is to the left of conditional distribution 906. Conditional distribution 902 is associated with all charged cells in the victim group which have two uncharged neighbors. For example, victim cell 872 in FIG. 8 falls into this group. Note that it has lost the most charge compared to the other conditional distributions, so it is to the left of both conditional distribution 904 and conditional distribution 906.

To put it another way, let $x_1$ be a first read threshold used to obtain a first raw read associated with unaffected cells (e.g., conditional distribution 906), let $x_2$ be a second read threshold used to obtain a second raw read associated with moderately affected cells (e.g., conditional distribution 904), and let $x_3$ be a third read threshold used to obtain a third raw read associated with significantly affected cells (e.g., conditional distribution 902). $x_1$ will be greater than $x_2$ and $x_2$ will be greater than $x_3$.

Figure 10:
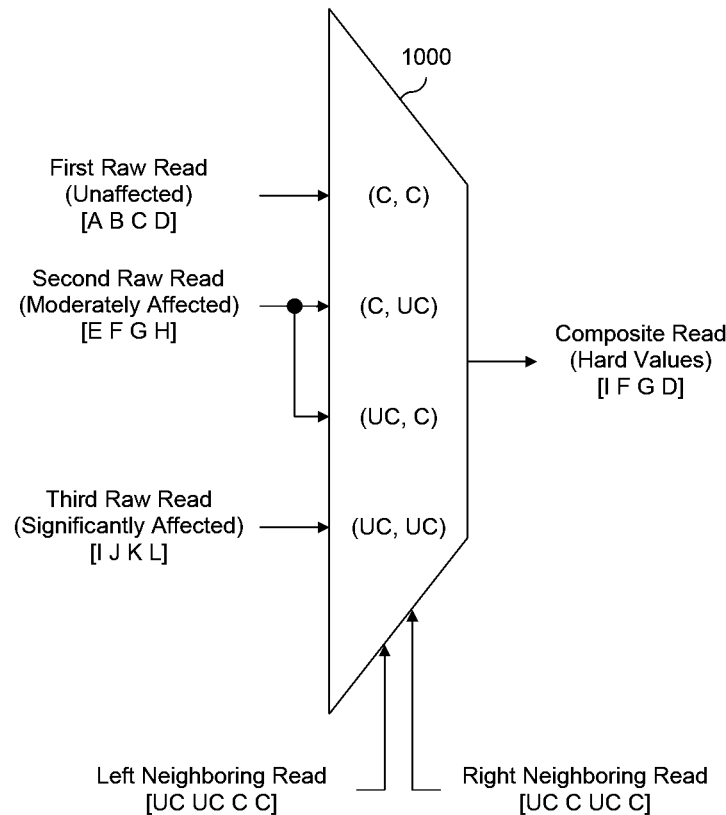
FIG. 10 is a diagram illustrating an embodiment of a composite read generator associated with 3D NAND.

FIG. 10 is a diagram illustrating an embodiment of a composite read generator associated with 3D NAND. In some embodiments, composite read generator 204 in FIG. 2 is implemented as shown and solid state storage 250 includes 3D NAND cells.

In the example shown, multiplexer 1000 is used to generate a composite read for a (victim) group of 3D NAND cells. In this example, the first raw read (associated with unaffected cells in the victim group) is [A B C D], the second raw read (associated with moderately affected cells in the victim group) is [E F G H], and the third raw read (associated with significantly affected cells in the victim group) is [I J K L]. The first raw read is passed to the (C, C) input, the second raw read is passed to the (C, UC) and (UC, C) inputs, and the third raw read is passed to the (UC, UC) input. In this example, the first term in the tuple indicates the value of a related cell in a left neighbor and the second term in the tuple indicates the value of a related cell in a right neighbor where "UC" means uncharged and "C" means charged. In diagrams 800, 820, 840, and 860 in FIG. 8, for example, the tuples would be (C, C), (UC, C), (C, UC), and (UC, UC), respectively.

In this example, the left neighboring read is [UC UC C C] and the right neighboring read is [UC C UC C]. For the first term in the composite read, since the first neighboring read values are (UC, UC), the first cell in the victim group would have lost a significant amount of charge since neither neighbor would have acted as a retaining wall. So, for the first term in the composite read, the corresponding value in the third raw read (corresponding to the significantly affected scenario) is selected (i.e., I). This process is repeated for each bit or symbol, producing a composite read of [I F G D].

Figure 11:
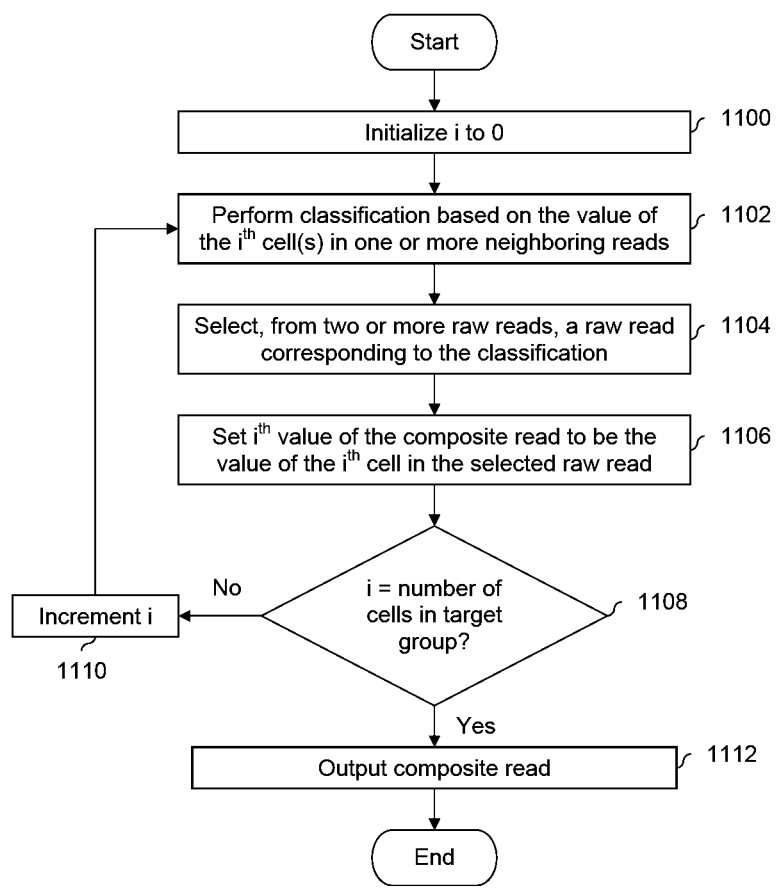
FIG. 11 is a flowchart illustrating an embodiment of a process for generating a composite read.

FIG. 11 is a flowchart illustrating an embodiment of a process for generating a composite read. In some embodiments, step 106 in FIG. 1 includes the example process. At 1100, i is initialized to 0. In this process, i is used to track which bit or symbol in the composite read is being selected.

At 1102, classification is performed based on the value of the $i^{th}$ cell(s) in one or more neighboring reads. For example, in FIG. 3, there are two possible classes: either the cell in question in the victim group is unaffected (i.e., $\epsilon$) or the cell in question in the victim group is affected (i.e., $\Delta$). In the example of FIG. 3, there are three possible classes: the cell in question in the victim group is unaffected (i.e., (C, C)), the cell in question in the victim group is moderately affected (i.e., (UC, C) or (C, UC)), or the cell in question in the victim group is significantly affected (i.e., (UC, UC)).

In some embodiments, step 1102 takes into consideration different neighbors affecting a cell in a victim group to different levels or degrees. See, for example, FIGS. 6 and 7. Alternatively, in some other embodiments, neighbors affect a cell in a victim group to the same or equal degree in step 1102.

At 1104, a raw read corresponding to the classification is selected from two or more raw reads. For example, in FIG. 3, either the first raw read or the second raw read input to multiplexer 300 is selected. In the example of FIG. 10, one of the first raw read, the second raw read, or the third raw read (all of which are input to multiplexer 1000) is selected.

At 1106, the $i^{th}$ value of the composite read is set to be the value of the $i^{th}$ cell in the selected raw read. See, for example, the composite reads output by multiplexer 300 in FIG. 3 and multiplexer 1000 in FIG. 10.

At 1108, it is determined if i equals the number of cells in a target group. For example, in FIGS. 3 and 10, there are four cells in the target groups shown therein. To put it another way, the check at 1108 is to see if the composite read is complete and is ready to be output. If the decision at step 1108 is yes, then the composite read is output at 1112. If the decision at step 1108 is no, then i is incremented at 1110 and the next bit or symbol in the composite read is selected.

Figure 12:
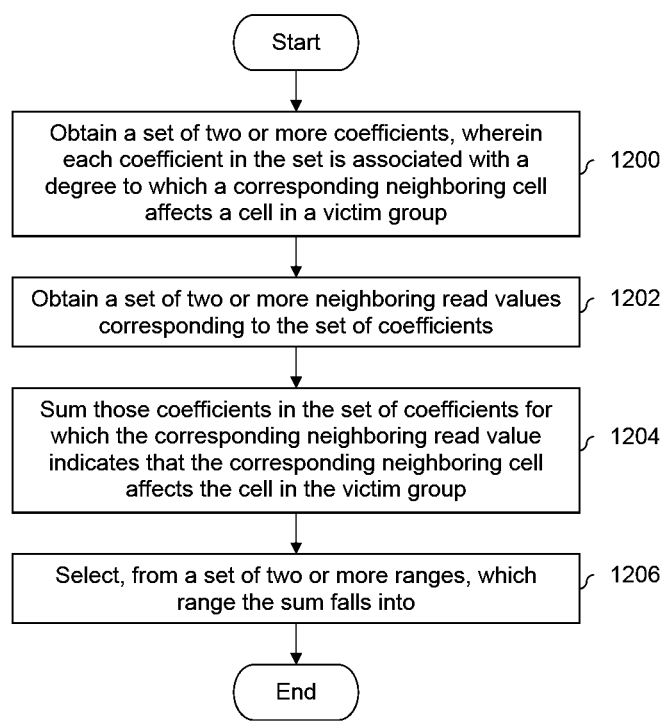
FIG. 12 is a flowchart illustrating an embodiment of a process for performing classification where different neighbors affect a cell in a victim group to different degrees.

FIG. 12 is a flowchart illustrating an embodiment of a process for performing classification where different neighbors affect a cell in a victim group to different degrees. In some embodiments, step 1102 in FIG. 11 includes the example process.

At 1200, a set of two or more coefficients is obtained, wherein each coefficient in the set is associated with a degree to which a corresponding neighboring cell affects a cell in a victim group. In FIG. 6, for example, the set of coefficients associated with neighbors 604, 606, 608, 610, and 612 is (0.15, 0.15, 0.10, 0.05, 0.05), respectively.

At 1202, a set of two or more neighboring read values corresponding to the set of coefficients is obtained. For example, in the seventh row shown in FIG. 7, the set of neighboring read values associated with neighbors 604, 606, 608, 610, and 612 is (Aggressor=No, Aggressor=No, Aggressor=Yes, Aggressor=Yes, Aggressor=No), respectively.

At 1204, those coefficients in the set of coefficients for which the corresponding neighboring read value indicates that the corresponding neighboring cell affects the cell in the victim group are summed. In the seventh row of FIG. 7, for example, $a_i$=(0+0+0.10+0.05+0)=0.15.

At 1206, a range which the sum falls into is selected from a set of two or more ranges. For example, in FIG. 7, there may be three ranges: [0, 0.10] (e.g., a substantially unaffected range), [0.10, 0.25] (e.g., a moderately affected range), and

[0.25, 0.5] (e.g., a significantly affected range). For the seventh row in FIG. 7 where $a_i=0.15$, the sum falls into the second range of [0.10, 0.25] and that range is selected. This selected range may be output (e.g., so that the classification can be used by step 1104 in FIG. 11 to select a raw read).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a storage interface configured to:
read a victim group of one or more cells using a first read threshold to obtain a first raw read which includes one or more values; and
read the victim group of cells using a second read threshold to obtain a second raw read which includes one or more values; and
a composite read generator configured to:
obtain a neighboring read, corresponding to a neighboring group of one or more cells associated with the victim group of cells; and
generate a composite read, including by selecting from at least a first possible value and a second possible value based at least in part on the neighboring read.

2. The system of claim 1, wherein:
the neighboring read includes a successfully error correction decoded neighboring read;
the system further includes a buffer which is configured to store one or more successfully error correction decoded data; and
the composite read generator is configured to obtain the successfully error correction decoded neighboring read from the buffer.

3. The system of claim 1, wherein the composite read generator is configured to obtain the neighboring read, including by using the storage interface to read the neighboring group.

4. The system of claim 1, wherein:
the composite read generated by the composite read generator includes one or more soft values; and
the system further includes a soft input error correction decoder configured to perform error correction decoding on the composite read.

5. The system of claim 1, wherein the composite read generated by the composite read generator includes one or more hard values.

6. The system of claim 1, wherein the composite read generator includes a multiplexer configured to: (1) use the first raw read and the second raw read as input signals and (2) use the neighboring read as a select signal.

7. The system of claim 1, wherein the composite read generator includes:
a first log-likelihood ratio (LLR) generator configured to generate a first set of one or more LLR values based at least in part on a first subset of the first raw read and a first subset of the second raw read;
a second LLR generator configured to generate a second set of one or more LLR values based at least in part on a second subset of the first raw read and a second subset of the second raw read, wherein (1) the first subset of the first raw read and the second subset of the first raw read are mutually exclusive and (2) the first subset of the second raw read and the second subset of the second raw read are mutually exclusive; and
a multiplexer configured to: (1) use the first set of LLR values and the second set of LLR values as input signals and (2) use the neighboring read as a select signal.

8. The system of claim 1, wherein the victim group of cells and the neighboring group of cells are stored on solid state storage which includes one or more floating-gate transistors.

9. The system of claim 1, wherein the victim group of cells and the neighboring group of cells are stored on solid state storage which includes 3D NAND.

10. A method, comprising:
reading a victim group of one or more cells using a first read threshold to obtain a first raw read which includes one or more values;
reading the victim group of cells using a second read threshold to obtain a second raw read which includes one or more values;
obtaining a neighboring read, corresponding to a neighboring group of one or more cells associated with the victim group of cells;
generating a composite read, including by selecting from at least a first possible value and a second possible value based at least in part on the neighboring read; and
using an error correction decoder to perform error correction decoding on the composite read.

11. The method of claim 10, wherein:
the neighboring read includes a successfully error correction decoded neighboring read;
the method further includes storing one or more successfully error correction decoded data in a buffer; and
the successfully error correction decoded neighboring read is obtained from the buffer.

12. The method of claim 10, wherein:
the composite read includes one or more soft values; and
using an error correction decoder to perform error correction decoding on the composite read includes using a soft input error correction decoder to perform error correction decoding on the composite read.

13. The method of claim 10, wherein the composite read includes one or more hard values.

14. The method of claim 10, wherein generating the composite read includes using a multiplexer to: (1) use the first raw read and the second raw read as input signals and (2) use the neighboring read as a select signal.

15. The method of claim 10, wherein generating the composite read includes:
using a first log-likelihood ratio (LLR) generator to generate a first set of one or more LLR values based at least in part on a first subset of the first raw read and a first subset of the second raw read;
using a second LLR generator to generate a second set of one or more LLR values based at least in part on a second subset of the first raw read and a second subset of the second raw read, wherein (1) the first subset of the first raw read and the second subset of the first raw read are mutually exclusive and (2) the first subset of the second raw read and the second subset of the second raw read are mutually exclusive; and
using a multiplexer to: (1) use the first set of LLR values and the second set of LLR values as input signals and (2) use the neighboring read as a select signal.

16. The method of claim 10, wherein the victim group of cells and the neighboring group of cells are stored on solid state storage which includes one or more floating-gate transistors.

17. The method of claim 10, wherein the victim group of cells and the neighboring group of cells are stored on solid state storage which includes 3D NAND.

18. A computer program product, the computer program product being embodied in a non-transitory computer readable storage medium and comprising computer instructions for:
- reading a victim group of one or more cells using a first read threshold to obtain a first raw read which includes one or more values;
- reading the victim group of cells using a second read threshold to obtain a second raw read which includes one or more values;
- obtaining a neighboring read, corresponding to a neighboring group of one or more cells associated with the victim group of cells; and
- generating a composite read, including by selecting from at least a first possible value and a second possible value based at least in part on the neighboring read.

19. The computer program product of claim 18, wherein the victim group of cells and the neighboring group of cells are stored on solid state storage which includes one or more floating-gate transistors.

20. The computer program product of claim 18, wherein the victim group of cells and the neighboring group of cells are stored on solid state storage which includes 3D NAND.

* * * * *